United States Patent [19]

Fukuda

[11] Patent Number: 4,577,180

[45] Date of Patent: Mar. 18, 1986

[54] DIGITAL DATA CONVERTING METHOD AND APPARATUS THEREOF

[75] Inventor: Shinichi Fukuda, Tokyo, Japan

[73] Assignee: Sony Corporation, Tokyo, Japan

[21] Appl. No.: 673,374

[22] Filed: Nov. 20, 1984

[30] Foreign Application Priority Data

Nov. 24, 1983 [JP] Japan .................................. 58-221235

[51] Int. Cl.[4] .......................................... H03K 13/00
[52] U.S. Cl. ........................................... 340/347 DD
[58] Field of Search ................ 340/347 DD; 360/40, 360/39, 32; 371/55; 375/19; 358/261, 335, 339; 369/59

[56] References Cited

U.S. PATENT DOCUMENTS

| | | | |
|---|---|---|---|
| 3,631,471 | 12/1971 | Griffiths | 340/347 DD |
| 4,352,129 | 9/1982 | Baldwin | 340/347 DD |
| 4,387,364 | 6/1983 | Shirota | 340/347 DD |
| 4,425,562 | 1/1984 | DeNiet | 340/347 DD |

Primary Examiner—Charles D. Miller
Attorney, Agent, or Firm—Lewis H. Eslinger; Alvin Sinderbrand

[57] ABSTRACT

A digital signal is divided into a series of base words with each m bits of data. Each base word is converted to a converted word having n bits of data, wherein each of n and m is an integer and n is greater than m and the converted word has a predetermined maximum number of consecutive digital zeroes. The value of every odd-numbered bits of said converted word is detected. The converted word is controlled in response to the result of the detection and modulated as an NRZI (non-return to zero, inverted)-coded digital signal with a DC component of zero.

6 Claims, 17 Drawing Figures

| No. | Q'=-1 CODE | DC | DSV | DV | P | Q | Q'=1 CODE | DC | DSV | DV | P | Q |
|---|---|---|---|---|---|---|---|---|---|---|---|---|
| 1 | 1100100010 | 0 | 3 | 21 | 0 | -1 | 0100100010 | 0 | 3 | 21 | 1 | -1 |
| 2 | 1101110111 | 0 | 2 | 13 | 0 | -1 | 0101110111 | 0 | 2 | 13 | 1 | -1 |
| 3 | 1101110010 | 0 | 2 | 13 | 0 | -1 | 0101110010 | 0 | 2 | 13 | 1 | -1 |
| 4 | 1101010101 | 0 | 2 | 13 | 0 | -1 | 0101010101 | 0 | 2 | 13 | 1 | -1 |
| 5 | 1101011101 | 0 | 2 | 13 | 1 | 1 | 0101011101 | 0 | 2 | 13 | 0 | 1 |
| 6 | 1101011111 | 0 | 2 | 9 | 0 | -1 | 0101011111 | 0 | 2 | 9 | 1 | -1 |
| 7 | 1101011010 | 0 | 2 | 9 | 0 | -1 | 0101011010 | 0 | 2 | 9 | 1 | -1 |
| 8 | 1101001001 | 0 | 2 | 13 | 1 | 1 | 0101001001 | 0 | 2 | 13 | 0 | 1 |
| 9 | 1101001011 | 0 | 2 | 9 | 0 | -1 | 0101001011 | 0 | 2 | 9 | 1 | -1 |
| 10 | 1101001110 | 0 | 2 | 9 | 0 | -1 | 0101001110 | 0 | 2 | 9 | 1 | -1 |
| 11 | 1101000100 | 0 | 2 | 13 | 0 | -1 | 0101000100 | 0 | 2 | 13 | 1 | -1 |
| 12 | 1111011101 | 0 | 2 | 13 | 0 | -1 | 0111011101 | 0 | 2 | 13 | 1 | -1 |
| 13 | 1111010101 | 0 | 2 | 13 | 1 | 1 | 0111010101 | 0 | 2 | 13 | 0 | 1 |
| 14 | 1111010111 | 0 | 2 | 9 | 0 | -1 | 0111010111 | 0 | 2 | 9 | 1 | -1 |
| 15 | 1111010010 | 0 | 2 | 9 | 0 | -1 | 0111010010 | 0 | 2 | 9 | 1 | -1 |
| 16 | 1111110111 | 0 | 2 | 13 | 1 | 1 | 0111110111 | 0 | 2 | 13 | 0 | 1 |
| 17 | 1111110101 | 0 | 2 | 9 | 0 | -1 | 0111110101 | 0 | 2 | 9 | 1 | -1 |
| 18 | 1111111101 | 0 | 2 | 9 | 1 | 1 | 0111111101 | 0 | 2 | 9 | 0 | 1 |
| 19 | 1111111111 | 0 | 1 | 5 | 0 | -1 | 0111111111 | 0 | 1 | 5 | 1 | -1 |
| 20 | 1111111010 | 0 | 1 | 5 | 0 | -1 | 0111111010 | 0 | 1 | 5 | 1 | -1 |
| 21 | 1111101001 | 0 | 2 | 9 | 1 | 1 | 0111101001 | 0 | 2 | 9 | 0 | 1 |
| 22 | 1111101011 | 0 | 1 | 5 | 0 | -1 | 0111101011 | 0 | 1 | 5 | 1 | -1 |
| 23 | 1111101110 | 0 | 1 | 5 | 0 | -1 | 0111101110 | 0 | 1 | 5 | 1 | -1 |
| 24 | 1111100100 | 0 | 2 | 9 | 0 | -1 | 0111100100 | 0 | 2 | 9 | 1 | -1 |
| 25 | 1110100010 | 0 | 3 | 21 | 1 | 1 | 0110100010 | 0 | 3 | 21 | 0 | 1 |
| 26 | 1110100111 | 0 | 2 | 13 | 1 | 1 | 0110100111 | 0 | 2 | 13 | 0 | 1 |
| 27 | 1110100101 | 0 | 2 | 9 | 0 | -1 | 0110100101 | 0 | 2 | 9 | 1 | -1 |
| 28 | 1110101101 | 0 | 2 | 9 | 1 | 1 | 0110101101 | 0 | 2 | 9 | 0 | 1 |
| 29 | 1110101111 | 0 | 1 | 5 | 0 | -1 | 0110101111 | 0 | 1 | 5 | 1 | -1 |
| 30 | 1110101010 | 0 | 1 | 5 | 0 | -1 | 0110101010 | 0 | 1 | 5 | 1 | -1 |
| 31 | 1110111001 | 0 | 2 | 9 | 1 | 1 | 0110111001 | 0 | 2 | 9 | 0 | 1 |
| 32 | 1110111011 | 0 | 1 | 5 | 0 | -1 | 0110111011 | 0 | 1 | 5 | 1 | -1 |
| 33 | 1110111110 | 0 | 1 | 5 | 0 | -1 | 0110111110 | 0 | 1 | 5 | 1 | -1 |
| 34 | 1110110100 | 0 | 2 | 9 | 0 | -1 | 0110110100 | 0 | 2 | 9 | 1 | -1 |
| 35 | 1110010001 | 0 | 2 | 13 | 1 | 1 | 0110010001 | 0 | 2 | 13 | 0 | 1 |
| 36 | 1110010011 | 0 | 2 | 9 | 0 | -1 | 0110010011 | 0 | 2 | 9 | 1 | -1 |
| 37 | 1110010110 | 0 | 2 | 9 | 0 | -1 | 0110010110 | 0 | 2 | 9 | 1 | -1 |
| 38 | 1110011100 | 0 | 2 | 13 | 0 | -1 | 0110011100 | 0 | 2 | 13 | 1 | -1 |
| 39 | 0100011100 | 0 | 2 | 17 | 0 | -1 | 1100011100 | 0 | 2 | 17 | 1 | -1 |
| 40 | 0100010110 | 0 | 2 | 13 | 0 | -1 | 1100010110 | 0 | 2 | 13 | 1 | -1 |
| 41 | 0100010011 | 0 | 2 | 13 | 0 | -1 | 1100010011 | 0 | 2 | 13 | 1 | -1 |
| 42 | 0100010001 | 0 | 2 | 17 | 1 | 1 | 1100010001 | 0 | 2 | 17 | 0 | 1 |
| 43 | 0100110100 | 0 | 2 | 13 | 0 | -1 | 1100110100 | 0 | 2 | 13 | 1 | -1 |
| 44 | 0100111110 | 0 | 2 | 9 | 0 | -1 | 1100111110 | 0 | 2 | 9 | 1 | -1 |
| 45 | 0100111011 | 0 | 2 | 9 | 0 | -1 | 1100111011 | 0 | 2 | 9 | 1 | -1 |
| 46 | 0100111001 | 0 | 2 | 13 | 1 | 1 | 1100111001 | 0 | 2 | 13 | 0 | 1 |
| 47 | 0100101010 | 0 | 2 | 9 | 0 | -1 | 1100101010 | 0 | 2 | 9 | 1 | -1 |
| 48 | 0100101111 | 0 | 2 | 9 | 0 | -1 | 1100101111 | 0 | 2 | 9 | 1 | -1 |
| 49 | 0100101101 | 0 | 2 | 13 | 1 | 1 | 1100101101 | 0 | 2 | 13 | 0 | 1 |
| 50 | 0100100101 | 0 | 2 | 13 | 0 | -1 | 1100100101 | 0 | 2 | 13 | 1 | -1 |
| 51 | 0100100111 | 0 | 2 | 17 | 1 | 1 | 1100100111 | 0 | 2 | 17 | 0 | 1 |
| 52 | 0101100100 | 0 | 2 | 13 | 0 | -1 | 1101100100 | 0 | 2 | 13 | 1 | -1 |
| 53 | 0101101110 | 0 | 2 | 9 | 0 | -1 | 1101101110 | 0 | 2 | 9 | 1 | -1 |
| 54 | 0101101011 | 0 | 2 | 9 | 0 | -1 | 1101101011 | 0 | 2 | 9 | 1 | -1 |

FIG. 6B

| | | | | | | | | | | |
|---|---|---|---|---|---|---|---|---|---|---|
| 55 | 0101101001 | 0 | 2 | 13 | 1 | 1 | 1101101001 | 0 | 2 | 13 | 0 | 1 |
| 56 | 0101111010 | 0 | 2 | 9 | 0 | -1 | 1101111010 | 0 | 2 | 9 | 1 | -1 |
| 57 | 0101111111 | 0 | 2 | 9 | 0 | -1 | 1101111111 | 0 | 2 | 9 | 1 | -1 |
| 58 | 0101111101 | 0 | 2 | 13 | 1 | 1 | 1101111101 | 0 | 2 | 13 | 0 | 1 |
| 59 | 0101110101 | 0 | 2 | 13 | 0 | -1 | 1101110101 | 0 | 2 | 13 | 1 | -1 |
| 60 | 0101010010 | 0 | 2 | 13 | 0 | -1 | 1101010010 | 0 | 2 | 13 | 1 | -1 |
| 61 | 0101010111 | 0 | 2 | 13 | 0 | -1 | 1101010111 | 0 | 2 | 13 | 1 | -1 |
| 62 | 0111000100 | 0 | 2 | 17 | 0 | -1 | 1111000100 | 0 | 2 | 17 | 1 | -1 |
| 63 | 0111001110 | 0 | 2 | 13 | 0 | -1 | 1111001110 | 0 | 2 | 13 | 1 | -1 |
| 64 | 0111001011 | 0 | 2 | 13 | 0 | -1 | 1111001011 | 0 | 2 | 13 | 1 | -1 |
| 65 | 0111001001 | 0 | 2 | 17 | 1 | 1 | 1111001001 | 0 | 2 | 17 | 0 | 1 |
| 66 | 0111011010 | 0 | 2 | 13 | 0 | -1 | 1111011010 | 0 | 2 | 13 | 1 | -1 |
| 67 | 0111011111 | 0 | 2 | 13 | 0 | 1 | 1111011111 | 0 | 2 | 13 | 1 | -1 |
| 68 | 0111110010 | 0 | 2 | 17 | 0 | -1 | 1111110010 | 0 | 2 | 17 | 1 | -1 |
| 69 | 1010001001 | 0 | 3 | 21 | 0 | -1 | 0010001001 | 0 | 3 | 21 | 1 | -1 |
| 70 | 1010011111 | 0 | 2 | 17 | 1 | 1 | 0010011111 | 0 | 2 | 17 | 0 | 1 |
| 71 | 1010011101 | 0 | 2 | 13 | 0 | -1 | 0010011101 | 0 | 2 | 13 | 1 | -1 |
| 72 | 1010010101 | 0 | 2 | 13 | 1 | 1 | 0010010101 | 0 | 2 | 13 | 0 | 1 |
| 73 | 1010010111 | 0 | 2 | 9 | 0 | -1 | 0010010111 | 0 | 2 | 9 | 1 | -1 |
| 74 | 1010010010 | 0 | 2 | 9 | 0 | -1 | 0010010010 | 0 | 2 | 9 | 1 | -1 |
| 75 | 1010110010 | 0 | 3 | 21 | 1 | 1 | 0010110010 | 0 | 3 | 21 | 0 | 1 |
| 76 | 1010110111 | 0 | 2 | 13 | 1 | 1 | 0010110111 | 0 | 2 | 13 | 0 | 1 |
| 77 | 1010110101 | 0 | 2 | 9 | 0 | -1 | 0010110101 | 0 | 2 | 9 | 1 | 1 |
| 78 | 1010111101 | 0 | 2 | 9 | 1 | 1 | 0010111101 | 0 | 2 | 9 | 0 | 1 |
| 79 | 1010111111 | 0 | 1 | 5 | 0 | -1 | 0010111111 | 0 | 1 | 5 | 1 | -1 |
| 80 | 1010111010 | 0 | 1 | 5 | 0 | 1 | 0010111010 | 0 | 1 | 5 | 1 | -1 |
| 81 | 1010101001 | 0 | 2 | 9 | 1 | 1 | 0010101001 | 0 | 2 | 9 | 0 | 1 |
| 82 | 1010101011 | 0 | 1 | 5 | 0 | -1 | 0010101011 | 0 | 1 | 5 | 1 | 1 |
| 83 | 1010101110 | 0 | 1 | 5 | 0 | -1 | 0010101110 | 0 | 1 | 5 | 1 | 1 |
| 84 | 1010100100 | 0 | 2 | 9 | 0 | -1 | 0010100100 | 0 | 2 | 9 | 1 | -1 |
| 85 | 1011100010 | 0 | 3 | 21 | 1 | 1 | 0011100010 | 0 | 3 | 21 | 0 | 1 |
| 86 | 1011100111 | 0 | 2 | 13 | 1 | 1 | 0011100111 | 0 | 2 | 13 | 0 | 1 |
| 87 | 1011100101 | 0 | 2 | 9 | 0 | -1 | 0011100101 | 0 | 2 | 9 | 1 | 1 |
| 88 | 1011101101 | 0 | 2 | 9 | 1 | 1 | 0011101101 | 0 | 2 | 9 | 0 | 1 |
| 89 | 1011101111 | 0 | 1 | 5 | 0 | 1 | 0011101111 | 0 | 1 | 5 | 1 | -1 |
| 90 | 1011101010 | 0 | 1 | 5 | 0 | -1 | 0011101010 | 0 | 1 | 5 | 1 | -1 |
| 91 | 1011111001 | 0 | 2 | 9 | 1 | 1 | 0011111001 | 0 | 2 | 9 | 0 | 1 |
| 92 | 1011111011 | 0 | 1 | 5 | 0 | -1 | 0011111011 | 0 | 1 | 5 | 1 | -1 |
| 93 | 1011111110 | 0 | 1 | 5 | 0 | -1 | 0011111110 | 0 | 1 | 5 | 1 | -1 |
| 94 | 1011110100 | 0 | 2 | 9 | 0 | -1 | 0011110100 | 0 | 2 | 9 | 1 | -1 |
| 95 | 1011010001 | 0 | 2 | 13 | 1 | 1 | 0011010001 | 0 | 2 | 13 | 0 | 1 |
| 96 | 1011010011 | 0 | 2 | 9 | 0 | -1 | 0011010011 | 0 | 2 | 9 | 1 | -1 |
| 97 | 1011010110 | 0 | 2 | 9 | 0 | -1 | 0011010110 | 0 | 2 | 9 | 1 | -1 |
| 98 | 1011011100 | 0 | 2 | 13 | 0 | -1 | 0011011100 | 0 | 2 | 13 | 1 | -1 |
| 99 | 0010000100 | 0 | 3 | 25 | 0 | -1 | 1010000100 | 0 | 3 | 25 | 1 | -1 |
| 100 | 0010001110 | 0 | 3 | 21 | 0 | -1 | 1010001110 | 0 | 3 | 21 | 1 | -1 |
| 101 | 0010001011 | 0 | 3 | 21 | 0 | -1 | 1010001011 | 0 | 3 | 21 | 1 | -1 |
| 102 | 0010011010 | 0 | 3 | 21 | 0 | -1 | 1010011010 | 0 | 3 | 21 | 1 | -1 |
| 103 | 1100101100 | 2 | 3 | 25 | 1 | -1 | 0100101100 | -2 | 3 | 25 | 0 | -1 |
| 104 | 1100100110 | 2 | 3 | 21 | 1 | -1 | 0100100110 | -2 | 3 | 21 | 0 | -1 |
| 105 | 1100100011 | 2 | 3 | 21 | 1 | -1 | 0100100011 | -2 | 3 | 21 | 0 | -1 |
| 106 | 1100100001 | 2 | 3 | 25 | 0 | 1 | 0100100001 | -2 | 3 | 25 | 1 | 1 |
| 107 | 1101111100 | 2 | 2 | 17 | 1 | -1 | 0101111100 | -2 | 2 | 17 | 0 | -1 |
| 108 | 1101110110 | 2 | 2 | 13 | 1 | -1 | 0101110110 | -2 | 2 | 13 | 0 | -1 |
| 109 | 1101110011 | 2 | 2 | 13 | 1 | -1 | 0101110011 | -2 | 2 | 13 | 0 | -1 |
| 110 | 1101110001 | 2 | 2 | 17 | 0 | 1 | 0101110001 | -2 | 2 | 17 | 1 | 1 |

FIG. 6C

| | | | | | | | | | | | |
|---|---|---|---|---|---|---|---|---|---|---|---|
| 111 | 1101010100 | 2 | 2 | 13 | 1 | -1 | 0101010100 | -2 | 2 | 13 | 0 | -1 |
| 112 | 1101011110 | 2 | 2 | 9 | 1 | -1 | 0101011110 | -2 | 2 | 9 | 0 | -1 |
| 113 | 1101011011 | 2 | 2 | 9 | 1 | -1 | 0101011011 | -2 | 2 | 9 | 0 | -1 |
| 114 | 1101011001 | 2 | 2 | 13 | 0 | 1 | 0101011001 | -2 | 2 | 13 | 1 | 1 |
| 115 | 1101001010 | 2 | 2 | 9 | 1 | -1 | 0101001010 | -2 | 2 | 9 | 0 | -1 |
| 116 | 1101001111 | 2 | 2 | 9 | 1 | -1 | 0101001111 | -2 | 2 | 9 | 0 | -1 |
| 117 | 1101001101 | 2 | 2 | 13 | 0 | 1 | 0101001101 | -2 | 2 | 13 | 1 | 1 |
| 118 | 1101000101 | 2 | 2 | 13 | 1 | -1 | 0101000101 | -2 | 2 | 13 | 0 | -1 |
| 119 | 1101000111 | 2 | 2 | 17 | 0 | 1 | 0101000111 | -2 | 2 | 17 | 1 | 1 |
| 120 | 1101000010 | 2 | 3 | 25 | 0 | 1 | 0101000010 | -2 | 3 | 25 | 1 | 1 |
| 121 | 1111011100 | 2 | 2 | 13 | 1 | -1 | 0110011100 | -2 | 2 | 13 | 0 | -1 |
| 122 | 1111010110 | 2 | 2 | 9 | 1 | -1 | 0111010110 | -2 | 2 | 9 | 0 | -1 |
| 123 | 1111010011 | 2 | 2 | 9 | 1 | -1 | 0111010011 | -2 | 2 | 9 | 0 | -1 |
| 124 | 1111010001 | 2 | 2 | 13 | 0 | 1 | 0111010001 | -2 | 2 | 13 | 1 | 1 |
| 125 | 1111110100 | 2 | 2 | 9 | 1 | -1 | 0111110100 | -2 | 2 | 9 | 0 | -1 |
| 126 | 1111111110 | 2 | 1 | 5 | 1 | -1 | 0111111110 | -2 | 1 | 5 | 0 | -1 |
| 127 | 1111111011 | 2 | 1 | 5 | 1 | -1 | 0111111011 | -2 | 1 | 5 | 0 | -1 |
| 128 | 1111111001 | 2 | 2 | 9 | 0 | 1 | 0111111001 | -2 | 2 | 9 | 1 | 1 |
| 129 | 1111101010 | 2 | 1 | 5 | 1 | -1 | 0111101010 | -2 | 1 | 5 | 0 | -1 |
| 130 | 1111101111 | 2 | 1 | 5 | 1 | -1 | 0111101111 | -2 | 1 | 5 | 0 | -1 |
| 131 | 1111101101 | 2 | 2 | 9 | 0 | 1 | 0111101101 | -2 | 2 | 9 | 1 | 1 |
| 132 | 1111100101 | 2 | 2 | 9 | 1 | -1 | 0111100101 | -2 | 2 | 9 | 0 | -1 |
| 133 | 1111100111 | 2 | 2 | 13 | 0 | 1 | 0111100111 | -2 | 2 | 13 | 1 | 1 |
| 134 | 1111100010 | 2 | 3 | 21 | 0 | 1 | 0111100010 | -2 | 3 | 21 | 1 | 1 |
| 135 | 1110100100 | 2 | 2 | 9 | 1 | -1 | 0110100100 | -2 | 2 | 9 | 0 | -1 |
| 136 | 1110101110 | 2 | 1 | 5 | 1 | -1 | 0110101110 | -2 | 1 | 5 | 0 | -1 |
| 137 | 1110101011 | 2 | 1 | 5 | 1 | -1 | 0110101011 | -2 | 1 | 5 | 0 | -1 |
| 138 | 1110101001 | 2 | 2 | 9 | 0 | 1 | 0110101001 | -2 | 2 | 9 | 1 | 1 |
| 139 | 1110111010 | 2 | 1 | 5 | 1 | -1 | 0110111010 | -2 | 1 | 5 | 0 | -1 |
| 140 | 1110111111 | 2 | 1 | 5 | 1 | -1 | 0110111111 | 2 | 1 | 5 | 0 | -1 |
| 141 | 1110111101 | 2 | 2 | 9 | 0 | 1 | 0110111101 | -2 | 2 | 9 | 1 | 1 |
| 142 | 1110110101 | 2 | 2 | 9 | 1 | -1 | 0110110101 | -2 | 2 | 9 | 0 | -1 |
| 143 | 1110110111 | 2 | 2 | 13 | 0 | 1 | 0110110111 | -2 | 2 | 13 | 1 | 1 |
| 144 | 1110110010 | 2 | 3 | 21 | 0 | 1 | 0110110010 | 2 | 3 | 21 | 1 | 1 |
| 145 | 1110010010 | 2 | 2 | 9 | 1 | -1 | 0110010010 | -2 | 2 | 9 | 0 | -1 |
| 146 | 1110010111 | 2 | 2 | 9 | 1 | -1 | 0110010111 | -2 | 2 | 9 | 0 | -1 |
| 147 | 1110010101 | 2 | 2 | 13 | 0 | 1 | 0110010101 | -2 | 2 | 13 | 1 | 1 |
| 148 | 1110011101 | 2 | 2 | 13 | 1 | -1 | 0110011101 | -2 | 2 | 13 | 0 | -1 |
| 149 | 1110011111 | 2 | 2 | 17 | 0 | 1 | 0110011111 | -2 | 2 | 17 | 1 | 1 |
| 150 | 1110011010 | 2 | 3 | 25 | 0 | 1 | 0110011010 | -2 | 3 | 25 | 1 | 1 |
| 151 | 1110001001 | 2 | 3 | 21 | 1 | -1 | 0110001001 | -2 | 3 | 21 | 0 | -1 |
| 152 | 1110001011 | 2 | 3 | 25 | 0 | 1 | 0110001011 | -2 | 3 | 25 | 1 | 1 |
| 153 | 1110001110 | 2 | 3 | 33 | 0 | 1 | 0110001110 | -2 | 3 | 33 | 1 | 1 |
| 154 | 1110000100 | 2 | 4 | 45 | 0 | 1 | 0110000100 | -2 | 4 | 45 | 1 | 1 |
| 155 | 1010011100 | 2 | 2 | 13 | 1 | -1 | 0010011100 | -2 | 2 | 13 | 0 | -1 |
| 156 | 1010010110 | 2 | 2 | 9 | 1 | -1 | 0010010110 | -2 | 2 | 9 | 0 | -1 |
| 157 | 1010010011 | 2 | 2 | 9 | 1 | -1 | 0010010011 | -2 | 2 | 9 | 0 | -1 |
| 158 | 1010010001 | 2 | 2 | 13 | 0 | 1 | 0010010001 | -2 | 2 | 13 | 1 | 1 |
| 159 | 1010110100 | 2 | 2 | 9 | 1 | -1 | 0010110100 | -2 | 2 | 9 | 0 | -1 |
| 160 | 1010111110 | 2 | 1 | 5 | 1 | -1 | 0010111110 | -2 | 1 | 5 | 0 | -1 |
| 161 | 1010111011 | 2 | 1 | 5 | 1 | -1 | 0010111011 | -2 | 1 | 5 | 0 | -1 |
| 162 | 1010111001 | 2 | 2 | 9 | 0 | 1 | 0010111001 | -2 | 2 | 9 | 1 | 1 |
| 163 | 1010101010 | 2 | 1 | 5 | 1 | -1 | 0010101010 | -2 | 1 | 5 | 0 | -1 |
| 164 | 1010101111 | 2 | 1 | 5 | 1 | -1 | 0010101111 | -2 | 1 | 5 | 0 | -1 |
| 165 | 1010101101 | 2 | 2 | 9 | 0 | 1 | 0010101101 | -2 | 2 | 9 | 1 | 1 |
| 166 | 1010100101 | 2 | 2 | 9 | 1 | -1 | 0010100101 | -2 | 2 | 9 | 0 | -1 |

FIG. 6D

| | | | | | | | | | | |
|---|---|---|---|---|---|---|---|---|---|---|
| 167 | 1010100111 | 2 | 2 | 13 | 0 | 1 | 0010100111 | -2 | 2 | 13 | 1 | 1 |
| 168 | 1010100010 | 2 | 3 | 21 | 0 | 1 | 0010100010 | -2 | 3 | 21 | 1 | 1 |
| 169 | 1011100100 | 2 | 2 | 9 | 1 | -1 | 0011100100 | -2 | 2 | 9 | 0 | -1 |
| 170 | 1011101110 | 2 | 1 | 5 | 1 | -1 | 0011101110 | -2 | 1 | 5 | 0 | -1 |
| 171 | 1011101011 | 2 | 1 | 5 | 1 | -1 | 0011101011 | -2 | 1 | 5 | 0 | -1 |
| 172 | 1011101001 | 2 | 2 | 9 | 0 | 1 | 0011101001 | -2 | 2 | 9 | 1 | 1 |
| 173 | 1011111010 | 2 | 1 | 5 | 1 | -1 | 0011111010 | -2 | 1 | 5 | 0 | -1 |
| 174 | 1011111111 | 2 | 1 | 5 | 1 | -1 | 0011111111 | -2 | 1 | 5 | 0 | -1 |
| 175 | 1011111101 | 2 | 2 | 9 | 0 | 1 | 0011111101 | -2 | 2 | 9 | 1 | 1 |
| 176 | 1011110101 | 2 | 2 | 9 | 1 | -1 | 0011110101 | -2 | 2 | 9 | 0 | -1 |
| 177 | 1011110111 | 2 | 2 | 13 | 0 | 1 | 0011110111 | -2 | 2 | 13 | 1 | 1 |
| 178 | 1011110010 | 2 | 3 | 21 | 0 | 1 | 0011110010 | -2 | 3 | 21 | 1 | 1 |
| 179 | 1011010010 | 2 | 2 | 9 | 1 | -1 | 0011010010 | -2 | 2 | 9 | 0 | -1 |
| 180 | 1011010111 | 2 | 2 | 9 | 1 | -1 | 0011010111 | -2 | 2 | 9 | 0 | -1 |
| 181 | 1011010101 | 2 | 2 | 13 | 0 | 1 | 0011010101 | -2 | 2 | 13 | 1 | 1 |
| 182 | 1011011101 | 2 | 2 | 13 | 1 | -1 | 0011011101 | -2 | 2 | 13 | 0 | -1 |
| 183 | 1011011111 | 2 | 2 | 17 | 0 | 1 | 0011011111 | -2 | 2 | 17 | 1 | 1 |
| 184 | 1011011010 | 2 | 3 | 25 | 0 | 1 | 0011011010 | -2 | 3 | 25 | 0 | 1 |
| 185 | 1011001001 | 2 | 3 | 21 | 1 | -1 | 0011001001 | -2 | 3 | 21 | 0 | -1 |
| 186 | 1011001011 | 2 | 3 | 25 | 0 | 1 | 0011001011 | -2 | 3 | 25 | 1 | 1 |
| 187 | 1011001110 | 2 | 3 | 33 | 0 | 1 | 0011001110 | -2 | 3 | 33 | 1 | 1 |
| 188 | 1011000100 | 2 | 4 | 45 | 0 | 1 | 0011000100 | -2 | 4 | 45 | 1 | 1 |
| 189 | 0100001110 | 2 | 3 | 37 | 0 | 1 | 1100001110 | -2 | 3 | 37 | 1 | 1 |
| 190 | 0100001011 | 2 | 3 | 29 | 0 | 1 | 1100001011 | -2 | 3 | 29 | 1 | 1 |
| 191 | 0100001001 | 2 | 3 | 25 | 1 | -1 | 1100001001 | -2 | 3 | 25 | 0 | -1 |
| 192 | 0100011010 | 2 | 3 | 29 | 0 | 1 | 1100011010 | -2 | 3 | 29 | 1 | 1 |
| 193 | 0100011111 | 2 | 2 | 21 | 0 | 1 | 1100011111 | -2 | 2 | 21 | 1 | 1 |
| 194 | 0100011101 | 2 | 2 | 17 | 1 | -1 | 1100011101 | -2 | 2 | 17 | 0 | -1 |
| 195 | 0100010101 | 2 | 2 | 17 | 0 | 1 | 1100010101 | -2 | 2 | 17 | 1 | 1 |
| 196 | 0100010111 | 2 | 2 | 13 | 1 | -1 | 1100010111 | -2 | 2 | 13 | 0 | -1 |
| 197 | 0100010010 | 2 | 2 | 13 | 1 | -1 | 1100010010 | -2 | 2 | 13 | 0 | -1 |
| 198 | 0100110010 | 2 | 3 | 25 | 0 | 1 | 1100110010 | -2 | 3 | 25 | 1 | 1 |
| 199 | 0100110111 | 2 | 2 | 17 | 0 | 1 | 1100110111 | -2 | 2 | 17 | 1 | 1 |
| 200 | 0100110101 | 2 | 2 | 13 | 1 | -1 | 1100110101 | -2 | 2 | 13 | 0 | -1 |
| 201 | 0100111101 | 2 | 2 | 13 | 0 | 1 | 1100111101 | -2 | 2 | 13 | 1 | 1 |
| 202 | 0100111111 | 2 | 2 | 9 | 1 | -1 | 1100111111 | -2 | 2 | 9 | 0 | -1 |
| 203 | 0100111010 | 2 | 2 | 9 | 1 | -1 | 1100111010 | -2 | 2 | 9 | 0 | -1 |
| 204 | 0100101001 | 2 | 2 | 13 | 0 | 1 | 1100101001 | -2 | 2 | 13 | 1 | 1 |
| 205 | 0100101011 | 2 | 2 | 9 | 1 | -1 | 1100101011 | -2 | 2 | 9 | 0 | -1 |
| 206 | 0100101110 | 2 | 2 | 9 | 1 | -1 | 1100101110 | -2 | 2 | 9 | 0 | -1 |
| 207 | 0100100100 | 2 | 2 | 13 | 1 | -1 | 1100100100 | -2 | 2 | 13 | 0 | -1 |
| 208 | 0101100010 | 2 | 3 | 25 | 0 | 1 | 1101100010 | -2 | 3 | 25 | 1 | 1 |
| 209 | 0101100111 | 2 | 2 | 17 | 0 | 1 | 1101100111 | -2 | 2 | 17 | 1 | 1 |
| 210 | 0101100101 | 2 | 2 | 13 | 1 | -1 | 1101100101 | -2 | 2 | 13 | 0 | -1 |
| 211 | 0101101101 | 2 | 2 | 13 | 0 | 1 | 1101101101 | -2 | 2 | 13 | 1 | 1 |
| 212 | 0101101111 | 2 | 2 | 9 | 1 | -1 | 1101101111 | -2 | 2 | 9 | 0 | -1 |
| 213 | 0101101010 | 2 | 2 | 9 | 1 | -1 | 1101101010 | -2 | 2 | 9 | 0 | -1 |
| 214 | 0101111001 | 2 | 2 | 13 | 0 | 1 | 1101111001 | -2 | 2 | 13 | 1 | 1 |
| 215 | 0101111011 | 2 | 2 | 9 | 1 | -1 | 1101111011 | -2 | 2 | 9 | 0 | -1 |
| 216 | 0101111110 | 2 | 2 | 9 | 1 | -1 | 1101111110 | -2 | 2 | 9 | 0 | -1 |
| 217 | 0101110100 | 2 | 2 | 13 | 1 | -1 | 1101110100 | -2 | 2 | 13 | 0 | -1 |
| 218 | 0101010001 | 2 | 2 | 17 | 0 | 1 | 1101010001 | -2 | 2 | 17 | 1 | 1 |
| 219 | 0101010011 | 2 | 2 | 13 | 1 | -1 | 1101010011 | -2 | 2 | 13 | 0 | -1 |
| 220 | 0101010110 | 2 | 2 | 13 | 1 | -1 | 1101010110 | -2 | 2 | 13 | 0 | -1 |
| 221 | 0101011100 | 2 | 2 | 17 | 1 | -1 | 1101011100 | -2 | 2 | 17 | 0 | -1 |
| 222 | 0111000010 | 2 | 3 | 29 | 0 | 1 | 1111000010 | -2 | 3 | 29 | 1 | 1 |

FIG. 6E

| | | | | | | | | | | | |
|---|---|---|---|---|---|---|---|---|---|---|---|
| 223 | 0111000111 | 2 | 2 | 21 | 0 | 1 | 1111000111 | -2 | 2 | 21 | 1 | 1 |
| 224 | 0111000101 | 2 | 2 | 17 | 1 | -1 | 1111000101 | -2 | 2 | 17 | 0 | -1 |
| 225 | 0111001101 | 2 | 2 | 17 | 0 | 1 | 1111001101 | -2 | 2 | 17 | 1 | 1 |
| 226 | 0111001111 | 2 | 2 | 13 | 1 | -1 | 1111001111 | -2 | 2 | 13 | 0 | -1 |
| 227 | 0111001010 | 2 | 2 | 13 | 1 | -1 | 1111001010 | -2 | 2 | 13 | 0 | -1 |
| 228 | 0111011001 | 2 | 2 | 17 | 0 | 1 | 1111011001 | -2 | 2 | 17 | 1 | 1 |
| 229 | 0111011011 | 2 | 2 | 13 | 1 | -1 | 1111011011 | -2 | 2 | 13 | 0 | -1 |
| 230 | 0111011110 | 2 | 2 | 13 | 1 | -1 | 1111011110 | -2 | 2 | 13 | 0 | -1 |
| 231 | 0111010100 | 2 | 2 | 17 | 1 | -1 | 1111010100 | -2 | 2 | 17 | 0 | -1 |
| 232 | 0111110001 | 2 | 2 | 21 | 0 | 1 | 1111110001 | -2 | 2 | 21 | 1 | 1 |
| 233 | 0111110011 | 2 | 2 | 17 | 1 | -1 | 1111110011 | -2 | 2 | 17 | 0 | -1 |
| 234 | 0111110110 | 2 | 2 | 17 | 1 | -1 | 1111110110 | -2 | 2 | 17 | 0 | -1 |
| 235 | 0111111100 | 2 | 2 | 21 | 1 | -1 | 1111111100 | -2 | 2 | 21 | 0 | -1 |
| 236 | 0110100001 | 2 | 3 | 29 | 0 | 1 | 1110100001 | -2 | 3 | 29 | 1 | 1 |
| 237 | 0110100011 | 2 | 3 | 25 | 1 | -1 | 1110100011 | -2 | 3 | 25 | 0 | -1 |
| 238 | 0110100110 | 2 | 3 | 25 | 1 | -1 | 1110100110 | -2 | 3 | 25 | 0 | -1 |
| 239 | 0110101100 | 2 | 3 | 29 | 1 | -1 | 1110101100 | -2 | 3 | 29 | 0 | -1 |
| 240 | 0010000111 | 2 | 3 | 29 | 0 | 1 | 1010000111 | -2 | 3 | 29 | 1 | 1 |
| 241 | 0010000101 | 2 | 3 | 25 | 1 | -1 | 1010000101 | -2 | 3 | 25 | 0 | -1 |
| 242 | 0010001101 | 2 | 3 | 25 | 0 | 1 | 1010001101 | -2 | 3 | 25 | 1 | 1 |
| 243 | 0010001111 | 2 | 3 | 21 | 1 | -1 | 1010001111 | -2 | 3 | 21 | 0 | -1 |
| 244 | 0010001010 | 2 | 3 | 21 | 1 | -1 | 1010001010 | -2 | 3 | 21 | 0 | -1 |
| 245 | 0010011001 | 2 | 3 | 25 | 0 | 1 | 1010011001 | -2 | 3 | 25 | 1 | 1 |
| 246 | 0010011011 | 2 | 3 | 21 | 1 | -1 | 1010011011 | -2 | 3 | 21 | 0 | -1 |
| 247 | 0010011110 | 2 | 3 | 21 | 1 | -1 | 1010011110 | -2 | 3 | 21 | 0 | -1 |
| 248 | 0010010100 | 2 | 3 | 25 | 1 | -1 | 1010010100 | -2 | 3 | 25 | 0 | -1 |
| 249 | 0010110001 | 2 | 3 | 29 | 0 | 1 | 1010110001 | -2 | 3 | 29 | 1 | 1 |
| 250 | 0010110011 | 2 | 3 | 25 | 1 | -1 | 1010110011 | -2 | 3 | 25 | 0 | -1 |
| 251 | 0010110110 | 2 | 3 | 25 | 1 | -1 | 1010110110 | -2 | 3 | 25 | 0 | -1 |
| 252 | 0010111100 | 2 | 3 | 29 | 1 | -1 | 1010111100 | -2 | 3 | 29 | 0 | -1 |
| 253 | 0011100001 | 2 | 3 | 37 | 0 | 1 | 1011100001 | -2 | 3 | 37 | 1 | 1 |
| 254 | 0011100011 | 2 | 3 | 33 | 1 | -1 | 1011100011 | -2 | 3 | 33 | 0 | -1 |
| 255 | 0011100110 | 2 | 3 | 33 | 1 | -1 | 1011100110 | -2 | 3 | 33 | 0 | -1 |
| 256 | 0011101100 | 2 | 3 | 37 | 1 | -1 | 1011101100 | -2 | 3 | 37 | 0 | -1 |

DIGITAL DATA CONVERTING METHOD AND APPARATUS THEREOF

BACKGROUND OF THE INVENTION

1. Field of the Invention

The present invention relates to a digital data converting method and the apparatus thereof and, more particularly, to a digital data converting method and apparatus thereof suitable for use with a case in which an audio signal or the like is pulse code-modulated (PCM) and then recorded.

2. Description of the Prior Art

There is known such an apparatus that an analog signal such as an audio signal or the like is converted into a PCM audio signal, magnetically recorded by using a rotary head without forming a guardband and then the audio signal is reproduced with high fidelity. In such known apparatus, in addition to a differentiated output characteristic of the magnetic recording and a low frequency crosstalk component generated from adjacent tracks, a low frequency component is cut off by a rotary transformer so that the low frequency component of the audio signal can not be reproduced with fidelity.

Accordingly, in the above apparatus which is requested to have a narrow record and playback frequency band and a small low frequency component, it is effective to modulate a record signal into the area of the low frequency component and DC component by a modulating system having a small amount of frequency spectrum component. A modulation system generally called as an NRZI (non-return to zero, inverted) is exemplified as one of such modulation systems. In the NRZI system, a signal is inverted at level "1" in the data signal, while not inverted at level "0" therein.

However, in the NRZI modulation system, when consecutive digital zeroes appear, the modulated signal is not inverted during that period and the frequency thereof becomes low. Thus, such a defect occurs that the DC component and the low frequency component are increased.

Therefore, it is proposed to divide the PCM digital information into bits of a desired number and to convert the respective bits to bits of a larger number, whereby to avoid the occurrence of a large number of consecutive digital zeroes.

The present applicant has previously proposed such information converting system as follows.

In this converting system, eight bits ($B_1$, $B_2$, $B_3$, $B_4$, $B_5$, $B_6$, $B_7$, $B_8$) of digital information in a base digital signal are converted to ten bits ($P_1$, $P_2$, $P_3$, $P_4$, $P_5$, $P_6$, $P_7$, $P_8$, $P_9$, $P_{10}$) Eight bits ($B_1$, $B_2$, $B_3$, $B_4$, $B_5$, $B_6$, $B_7$, $B_8$) can be combined in 256 ($2^8$) different ways.

With 10 bits ($P_1$, $P_2$, $P_3$, $P_4$, $P_5$, $P_6$, $P_7$, $P_8$, $P_9$, $P_{10}$), in order to remove the DC component, in the signal after the NRZI modulation it is sufficient that 5 bits in 10 bits are positive "1" and 5 bits are negative "0". In order to establish $T_{max}/T_{min}=4$ (where $T_{min}$ is the maximum interval between level transitions and $T_{min}$ is minimum interval between level transitions), such a condition is required that in the NRZI-coding, the number of consecutive digital zeroes is less than 3 or in the converted signal the consecution of the same levels is less than 4 bits.

With the above constrains, the following table I shows the possible combinations of ten digital bits in the NRZI code for which the DC component is zero, but in which there are no more than three digital zeroes in a row (either internally of each ten-bit word or at the juncture between two such words):

TABLE I

|        | ....1 | ....10 | ....100 | ....1000 |
|--------|-------|--------|---------|----------|
| 1...... | 69 | 34 | 14 | 4 |
| 01..... | 40 | 20 | 8 | 1 |
| 001.... | 20 | 10 | 3 | 1 |
| 0001... | 8 | 3 | 2 | 1 |

Table I shows that there are numerous possible combinations that will satisfy the constraints. For example, if up to three digital zeroes are permitted at the beginning of each word, then no digital zeroes can be permitted at the end of any word. In that case, Table I shows that the total of the possible combinations is:

$$137 = 69 + 40 + 20 + 8$$

From all of the possible combinations in Table I, the maximum total is achieved if no more than two digital zeroes are permitted at the beginning of a ten-bit converted word and no more than one digital zero is permitted at the end. In that case, the total is:

$$193 = 69 + 40 + 20 + 34 + 20 + 10$$

Thus, 193 ten-bit combinations are available for which the DC component is zero. These are called "primary combinations."

Since there are 256 possible eight-bit words of original data, 63 additional ten-bit combinations are required to represent all of the original data. Thus, it is necessary to use ten-bit combinations for which the DC component is not zero.

The following table illustrates the number of possible combinations of ten-bit combinations, which begin with no more than two digital zeroes and end with no more than one digital zero, having DC component with 0, −2 and +2 when NRZI-coded.

TABLE II

| first bit | | −2 | | 0 | | +2 | |
|---|---|---|---|---|---|---|---|
| 1... | 11...... | 52 | 40 | 103 | 60 | 100 | 43 |
|      | 101      |    | 11 |     | 30 |     | 30 |
|      | 100      |    | 1  |     | 13 |     | 27 |
| 01......... | | | 43 | | 60 | | 40 |
| 001......... | | | 30 | | 30 | | 11 |

From Table II, it is clear that the number of possible combinations in which DC charge is −2 is expressed as $$52 + 43 + 30 = 125$$

Also it is made clear that the number of possible combinations with +2 DC charge is expressed as $$100 + 40 + 11 = 151$$

To calculate the DC components for Table II, it was assumed that the last bit of the next-preceding ten-bit combination was at the signal's low level "0", as shown in FIGS. 1A to 1C. If Table II were constructed by assuming that the level of the last bit of the preceding word was high "1", then the "−2" and "+2" columns would be interchanged as shown in FIGS. 2A and 2B.

Further, the low frequency spectrum of the modulation wave tends to decrease more if the combination alternately using the combinations with +2 and −2 DC charges is used frequently than the combination with a zero DC charge. Accordingly, 125 combinations with a pair of +2 and −2 DC charges are used and remaining 131 combinations with a zero DC charge are used for 256 combinations of 8 bits, by which 125 combinations and 131 combinations are made corresponding one by one to 256 combinations of 8 bits and then selected.

As the combinations with the pair of +2 and −2 DC charges, the pair may be selected such that DC charge can be controlled only by changing the first bit (second bit and the following bits in combinations of a pair are formed as the same level). Therefore, of the possible combinations on, for example, Table II, the combinations with +2 and −2 DC charges and the first bit beginning with "0" expressed as $$40+11+43+30=124$$

are used. And, it is possible that 124 combinations and the combinations with a zero DC charge, in this case, 132 combinations are made corresponding one by one to 256 combinations of 8 bits. Then, each time the combination with ±2 DC charges appears, the first bit of the combination is converted in such a manner that the DC charge becomes positive and negative alternately.

That is, as shown in FIGS. 3A and 3B, when the combination with ±2 DC charges appears, the number of level transitions P (the number of digital one) from the second bit is counted, in which until the following combination with ±2 DC charges appears, if the number of level transitions is even, the first bit (shown by an inverted delta) is converted to digital one as shown in FIG. 3A, while if the number of level transitions is odd, the first bit remains as digital zero as shown in FIG. 3B.

Thus, even if ±2 DC charges appear, they are cancelled out by ±2 DC charges of the succeeding combination and hence regardless of any consecutive digital components, DC component becomes zero.

By the way, DC charge of each bit is generally called as a DSV (digital sum variation) which is one of the evaluation methods. Let it be considered that a combination is formed of 10-bit pattern with zero DC charge as, for example, shown in FIG. 4A. When transition of DSV begins with DSV=1, the transition of DSV of such combination is changed as shown by a solid line in FIG. 4B.

If the width between the maximum and minimum values of the DSV is small, the DSV has small DC component block and the low frequency component is reduced. As one of the evaluation methods, there is further known a parameter which is generally referred to as DSV variance. This DSV variance can be obtained by squaring and averaging DSV values of every bits and it is desired that this DSV variance is as small as possible. While the level of DSV=0 is defined as an average value of the DSV value of every bit, the level of DSV regarding the waveform of the combination (code) which was NRZI-coded is defined as DSV max = −DSV min. Accordingly, in this case, it is convenient that the DSV at the boundary between the respective combinations is taken as +1 or −1 and the intermediate value between DSV max and DSV min is defined as DSV=0.

Therefore, let us consider the above converting method by using the evaluation method of DSV variance. In the combination as, for example, shown in FIG. 4A, when the evaluation of DSV variance begins with DSV=+1, the transition of DSV changes along the solid line shown in FIG. 4B as described above and DSV variance at that time becomes 1.7. While, when the evaluation of DSV variance begins with DSV=−1, the transition of DSV changes as shown by a broken line in FIG. 4B and DSV variance at that time becomes 6.9. That is, the combinations of the same bit pattern are made to have different DC characteristics depending on the initial setting of the DSV. Particularly in this case, when the evaluation of DSV variance begins with DSV=−1, the DSV variance becomes large, which is not preferable.

FIG. 5 shows an example of an apparatus which is capable of conversion in accordance with the above converting system. In FIG. 5, reference numeral 1 designates an input terminal, 2 an 8-bit shift register which accepts information of 8 bits, 3 a conversion logic circuit which uses, for example, a programmable logic array (PLA), and 4 a clock terminal. Then, information applied to the input terminal 1 is transferred 8 bits by 8 bits through the shift register 2 in response to a pulse which is applied to the clock terminal 4 at the data bit rate and the information of 8 bits ($B_1$, $B_2$, $B_3$, $B_4$, $B_5$, $B_6$, $B_7$, $B_8$) is supplied to the conversion logic circuit 3.

Reference numeral 5 designates an identifying circuit which identifies whether the first bit is variable or fixed, namely, in this case, whether the DC charge of the combination is "0" or ±2. This identifying circuit 5 consists of, for example, exclusive-OR (hereinafter simply referred to as EOR) circuits 5a to 5c and an exclusive-NOR (hereinafter simply referred to as ENOR) circuit 5d. In this identifying circuit 5, the circuits 5a to 5d carry out modulo.-addition of the even-numbered bits of the output from the conversion logic circuit 3. In other words, the identifying circuit 5 detects whether the number of the digital zeroes of the even-numbered bits is even or odd. If it is 0(even), the identifying circuit 5 identifies that the combination has ±2 DC charges and produces high level "1" at its output side, namely, the output side of the ENOR circuit 5d. That is, the identifying circuit 5 carries out all EOR logic operations of the even-numbered bit outputs of the output of the conversion logic circuit 3. In this case, when the even-numbered bit is "1", the level transition is carried out in this portion so that the DC charges of this bit and the immediately preceding bit become 0. While, when the even-numbered bit is "0", there exist ±2 DC charges. Further, when there are two digital zeroes, the DC charge becomes 0 or ±4. In like manner, when there are three digital zeroes, the DC charge becomes ±2 or ±6. In other words, if the number of digital zeroes is even, the DC charge becomes 0, ±4, ±8 . . . , while if it is odd, DC charge becomes ±2, ±6, ±10 . . . , . On the other hand, the whole of the DC charge of 10 bits is restricted to 0 or −2. Accordingly, by detecting whether the number of digital zeroes of the above even-numbered bit is even or odd, it is possible to identify whether the DC charge is 0 or ±2.

The output of this identifying circuit 5 is supplied to one input terminal of an AND circuit 6 and the AND circuit 6 is supplied at its other input terminal with an output from a detecting circuit 8 which is provided at the output side of the shift register 7 for detecting the DC charge (DSV) of each combination. This detecting circuit 8 supplies the high level output to the input side of the AND circuit 6 when the DC charge DSV' up to the preceding combination is, for example, −1.

The output of the AND circuit 6 is supplied to one input terminal of an EOR circuit 11 which inverts the first bit in level. To the other input terminal of this EOR circuit 11 is supplied the first bit $P_1$ of 10 bits from the conversion logic circuit 3. Accordingly, when the output of the AND circuit 6 is "0", the first bit $P_1$ is not inverted in level and fed as it is to the shift register 7, while when the output of the AND circuit 6 is "1", the first bit $P_1$ is inverted in polarity and fed to the shift register 7.

Further, in FIG. 5, an EOR circuit 9 and a D-type flip-flop circuit 10 constitute an NRZI-modulating circuit.

The detecting circuit 8 includes an up-down counter 8a and this counter 8a is driven by a clock with ½ frequency to count only the even-numbered bits. Further, the up-down counter 8a is controlled by the output from the EOR circuit 9, thus the DC charge being detected. Since the output of the up-down counter 8a is always delayed by 2 bits, EOR circuits 8b and 8c are provided to correct the count value of the counter 8a by the last 2 bits.

Further in the detecting circuit 8, AND circuits 8d and 8e and a NOR circuit 8f are used to initially set the DC charge DSV to −1 or +1. When the DSV of the NRZI-modulated wave is counted by the counter 8a at every one or two bits, if the state of the DSV is taken as $|DSV| \leq 3$ in the range of DSV, there exist many DC charges such as −3, −2, −1, 0, +1, +2 and +3. Accordingly, the DSV is initially set to −1 or +1 by the AND circuits 8d and 8e and the NOR circuit 8f.

Thus, the positive or negative polarity of the DC charge is detected, and this detected signal and the signal from the identifying circuit 5 are supplied to the AND circuit 6 which then produces a control signal for controlling the level of the first bit of the output.

As to the combination of DC charge in which it is a combination with zero DC charge and a combination with ±2 DC charges, the conversion logic circuit 3 is adapted to produce it to be any one of them as unified. In this connection, when the conversion logic circuit 3 produces the output which is unified such that DC charge is −2, if the converted combination has −2 DC charge and the evaluation of DSV' variance begins with −1, the first bit thereof is inverted in level by the EOR circuit 11 (at this time, the output of the AND circuit 6 is high level) and then produced as a combination having +2 DC charge. Since the output of the identifying circuit 5 is low level and the output of the AND circuit 6 is also low level for the combination with a zero DC charge, it is directly produced without its first bit being inverted in level by the EOR circuit 11.

Further, a timing detecting circuit 12 detects the timing of the pulse which is applied to the clock terminal 4 at the data bit rate and the timing signal from the timing detecting circuit 12 is supplied to a load terminal LD of the shift register 7 at every 8-bit data.

As described above, the content or data converted to the form of 10-bit data and latched in the shift register 7 is sequentially read out therefrom on the basis of a clock signal with frequency 5/4 times the clock frequency of the input signal supplied thereto from a clock terminal 13. The signal thus read out from the shift register 7 is supplied to and NRZI-coded by the NRZI-modulating circuit which comprises the EOR circuit 9 and the flip-flop circuit 10 and then fed to an output terminal 14.

By the way, in the case of the circuit arrangement in which the PLA is used for the conversion logic circuit 3 as described above, the circuit for detecting whether the combination has zero DC charge or +2 DC charges and the like is required so that the circuit arrangement becomes complicated. This proposes no problem when a ROM (read-only memory) is used as the conversion logic circuit 3. However, the ROM causes the circuit arrangement to become large, and when this ROM is formed as an IC (integrated circuit), the ROM occupies a large pattern area and consumes much power. Further, in order to make the DSV variance small, it is desired that two combinations having zero DC charge are paired as many as possible and either of the pair having a smaller DSV variance is used on the basis of whether DSV is +1 or −1. In this case, such a detecting circuit is required to detect whether or not the first bit of the pair of the two combinations having the equal zero DC charge is variable. This makes the circuit arrangement more complicated.

Further, if a pair of two combinations are not limited to such ones in which bits succeeding the second bit are equal but be selected from ones having a small DSV variance, although the DSV variance can be made smaller, it is unavoidable that the circuit arrangement becomes more and more complicated.

Therefore, such a converting system is considered, which uses no detecting circuit.

In this converting system, when the combination in which DC charge is zero is used, all the first bit thereof is converted similarly to the combination in which DC charge is ±2. To this end, even when the first bit is inverted, possible combination must be formed in $2 \times 2^m$ different ways, or the 8/10-conversion scheme must have $2 \times 256$ possible combinations. It is therefore assumed that $T_{max} = 5T'$ ($T' = T_{min} = Tw$ (window margin of detecting window)). Then, the number of the usable combinations is 512 or above.

The following Table III shows the number of possible combinations of 10-bit information which can satisfy the condition of $T_{max} = 5T'$. In this case, to satisfy the condition of $T_{max} = 5T'$, in NRZI code, consecutive digital zeroes must never exceed four, or the same consecutive levels of digital signal after being modulated must never exceed 5 bits. Therefore, the bit must begin with at most two digital zeroes and also end with at most two digital zeroes.

TABLE III

| first bit | | | DC −2 | | DC 0 | | DC +2 | |
|---|---|---|---|---|---|---|---|---|
| 1 . . . 11 | . . . | . . . | 71 | 51 | 120 | 68 | 120 | 52 |
| 101 | | . . . | | 17 | | 34 | | 34 |
| 1001 | . . . | . . . | | 3 | | 18 | | 34 |
| 0 . . . 01 | . . . | . . . | 86 | 52 | 102 | 68 | 68 | 51 |
| 001 | . . . | . . . | | 34 | | 34 | | 17 |

In Table III, the information or word beginning with "100 . . . ", if the first bit thereof is inverted, becomes "000 . . . ", so that three consecutive digital zeroes are permitted at the beginning thereof. There is then a fear that four or above consecutive digital zeroes will occur at the boundary between the consecutive combinations, thus such combinations being unable to be used in this converting method. As a result, if such 55 (3+18+34) combinations are removed from all the possible combinations on Table III, 512 combinations are left there, which number is just twice the number of possible combinations of $2^8 = 256$.

Accordingly, 256 possible combinations each of which forms a pair with a different first bit can be made corresponding to 256 possible combinations of 8 bit data. In this connection, Table III shows 102 possible combinations each of which forms a pair having a zero DC charge and has a different first bit and 154 possible combinations each of which forms a pair having ±2 DC charges and has a different first bit.

Upon conversion, the pair of combinations are selected by detecting which of DSV = +1 and −1 make the DSV variance small. As described above in connection with FIG. 4, when the DC charge is −2, the evaluation of DSV variance begins with DSV = +1, while when the DC charge is +2, the evaluation of DSV variance begins with DSV = −1.

FIG. 6 (formed of FIGS. 6A to 6E) shows examples of 256 possible combinations (codes) which are selected on the basis of Table III, in which they are not corresponded to the data. FIG. 6 shows that a pair of two combinations should be selected only by controlling, for example, the first bit. In FIG. 6, reference Q' designates the DC charge information (corresponding to the preceding DSV = DSV') of the code (combination) before being converted, DV designates the variance of DSV, P designates the number of level transitions (even number is 0 and odd number is 1) in each code and Q designates the DC charge information (corresponding to the DSV of the code just after being converted) of the code just after being converted. When the example of the circuit arrangement shown in FIG. 5 uses the code of combinations in FIG. 6, a pair of codes from Nos. 1 to 102 having zero DC charge are used individually.

FIG. 7 schematically illustrates an example of an apparatus which carries out the conversion in accordance with this converting method. In FIG. 7, like parts corresponding to those in FIG. 5 are marked with the same references and will not be described in detail.

In the example shown in FIG. 7, upon conversion, the first bit of all the possible combinations is made variable so that a circuit for detecting whether the first bit is variable or fixed, namely, the circuit 5 as shown in FIG. 5 which detects whether the combination is the combination having zero DC charge (the first bit is fixed) or the combination having +2 DC charge (the first bit is variable) or the like is not necessary.

Therefore, in this example, the output of the detecting circuit 8 which detects the DC charge (DSV) is directly supplied to one input terminal of the EOR circuit 11. Other arrangements are formed similarly to FIG. 5.

The conversion logic circuit 3 produces its output with the first bit unified such that the preceding DSV' becomes −1 or +1. Accordingly, let it be assumed that DSV' = +1 be unified for the first bit. Then, when the converted combination begins with DSV' = −1, it is sufficient that the high level output of the detecting circuit 8 is supplied to the EOR circuit 11, in which the first bit thereof is inverted in level and then supplied to the shift register 7.

Accordingly, similarly to the above, the content or data of this shift register 7 is read out therefrom in response to the clock signal from the clock terminal 13, supplied through the EOR circuit 9 to the flip-flop circuit 10 and then developed at the output terminal 14 as the signal which is NRZI-coded.

As mentioned above, without using the detecting circuit 5 (and the AND circuit 6) as shown in FIG. 5, it is possible to carry out the 8/10 - conversion.

However, in the case of the prior circuit as mentioned above, since the waveform NRZI-coded in each combination is used to count the DC charge, the detecting circuit 8 which detects the DC charge becomes complicated in construction and becomes expensive in manufacturing cost.

OBJECTS AND SUMMARY OF THE INVENTION

It is an object of the present invention to provide an improved digital data converting method and apparatus thereof.

It is another object of the present invention to provide a digital data converting method and apparatus thereof in which a DC charge detecting circuit can be simplified in construction.

It is a further object of the present invention to provide an NRZI (non-return to zero, inverted)-coded signal having a DC component substantially equal to zero with a minimum of low frequency components.

It is a still further object of the present invention to provide a method and apparatus for converting a base digital signal into an NRZI-coded converted digital signal with a DC component substantially euqal to zero and a predetermined maximum time between level transitions.

According to one aspect of the present invention, there is provided a method for converting a digital signal into an NRZI-coded signal, the method comprising the steps of:

dividing a base digital signal into a series of base words with each m bits of data;

converting said base digital signal into a converted digital signal by matching a converted word with each said base word, each said converted words having n bits of data, wherein n is greater than m and said converted digital signal has a predetermined maximum number of consecutive digital zeroes;

detecting if the value of every odd-numbered bits of said converted word is digital zero;

producing a detecting signal according to the result of said detecting;

controlling said converted word in response to said detecting signal; and modulating said converted digital signal as an NRZI-coded digital signal.

According to another aspect of the present invention, there is provided an apparatus for converting a digital signal into an NRZI-coded signal, the apparatus comprising:

dividing means for dividing a base digital signal into a series of base words with each m bits of data;

converting means for converting said base digital signal into a converted digital signal by matching a converted word with each said base word, each said converted word having n bits of data, wherein n is greater than m and said converted digital signal has a predetermined maximum number of consecutive digital zeroes;

detecting means for detecting if the value of every odd-numbered bits of said converted word is digital zero;

producing means for producing a detecting signal according to the result of said detecting;

controlling means for controlling said converted word in response to said detecting signal; and generating means for generating said converted digital signal as an NRZI-coded digital signal.

The other objects, features and advantages of the present invention will become apparent from the following description taken in conjunction with the accompanying drawings through which the like references designate the same elements and parts.

BRIEF DESCRIPTION OF THE DRAWINGS

Figures 3A, 3B:
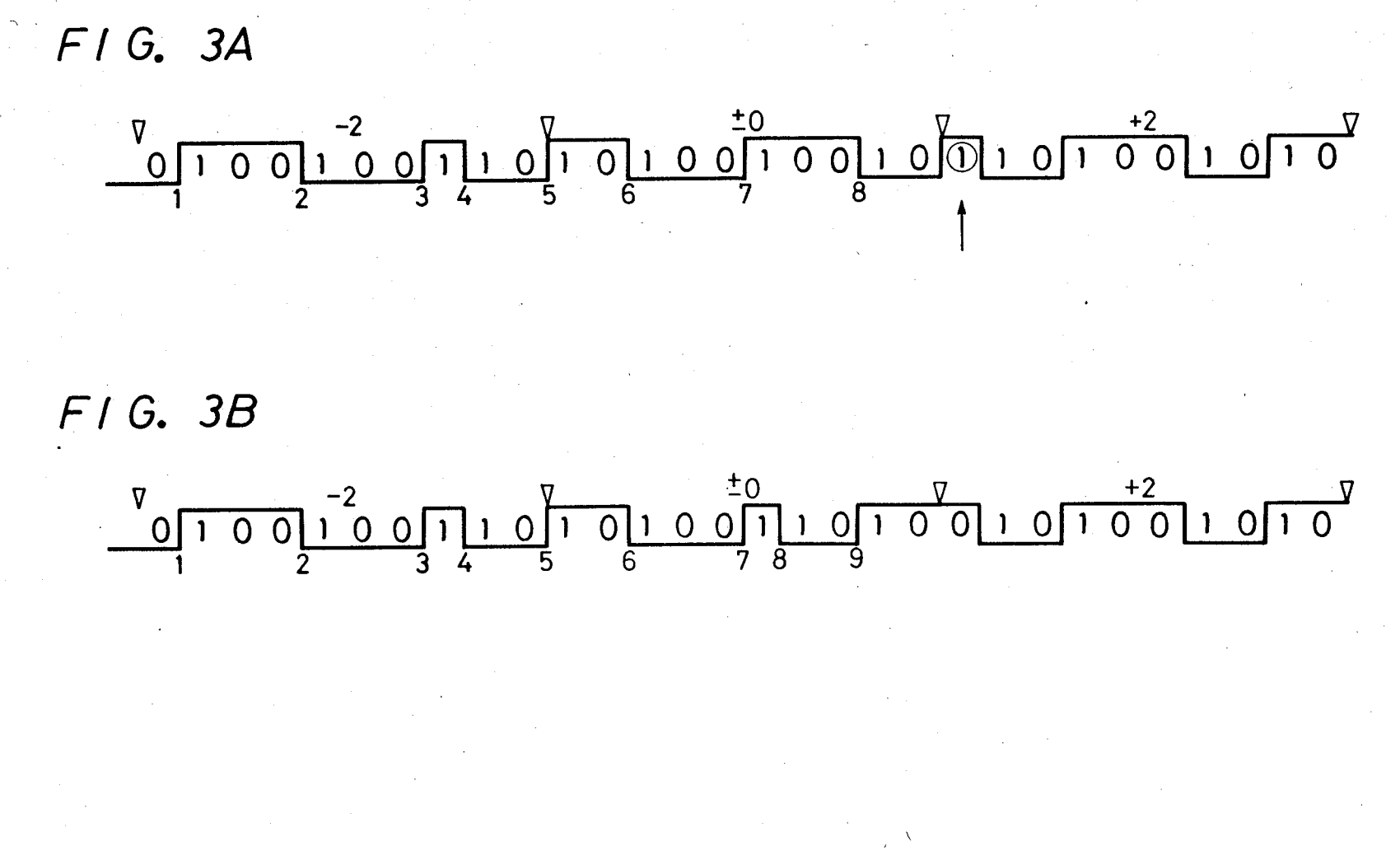

FIGS. 3A and 3B respectively illustrate converted digital signals;

FIG. 6 (formed of FIGS. 6A to 6E) is a diagram showing different ten-bit patterns;

DESCRIPTION OF THE PREFERRED EMBODIMENTS

Now, an embodiment of a method and apparatus for converting a digital signal according to the present invention will hereinafter be described in detail with reference to the drawings.

Figure 1A:
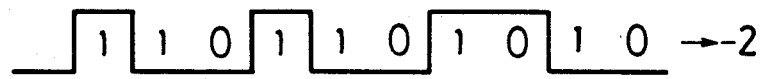
FIGS. 1A to 1C respectively illustrate possible ten-bit combinations of a converted digital signal NRZI-coded.
Figure 1B:
Figure 1C:
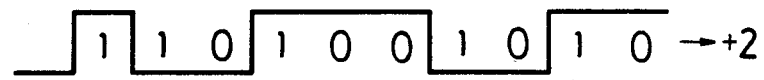
Figure 2A:
FIG. 2A illustrates a ten-bit combination of a converted digital signal NRZI-coded.
Figure 2A:
Figure 2B:
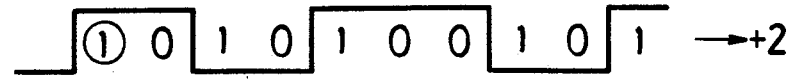
FIG. 2B illustrates the ten-bit combination shown in FIG. 2A with the first bit thereof being inverted from a digital zero to a digital one.
Figure 4A:
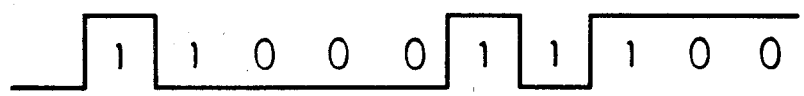
FIGS. 4A and 4B respectively illustrate a converted digital signal and variation of the DSV of the converted digital signal.
Figure 4B:
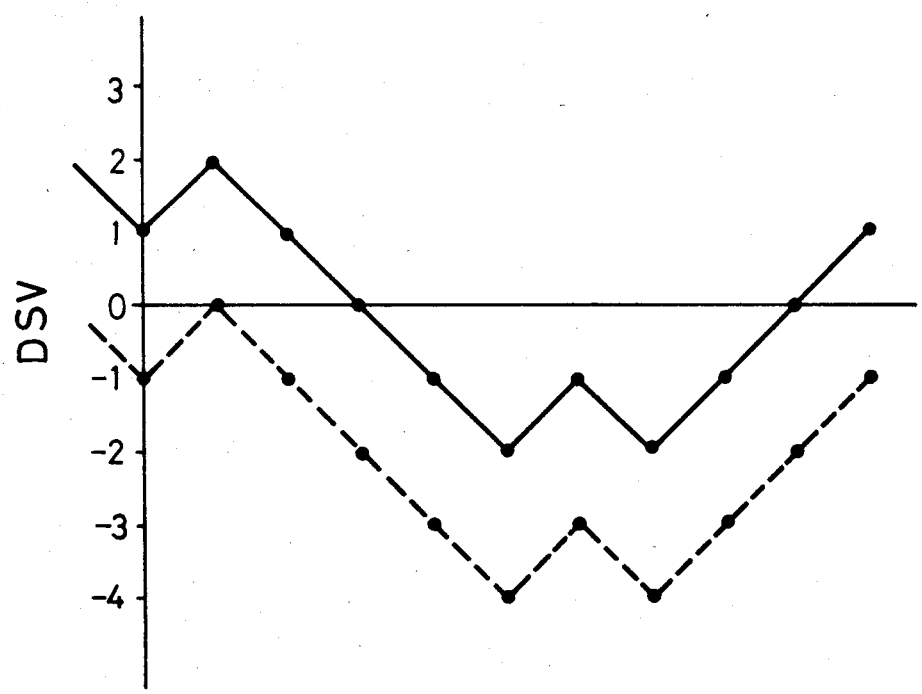
Figure 5:
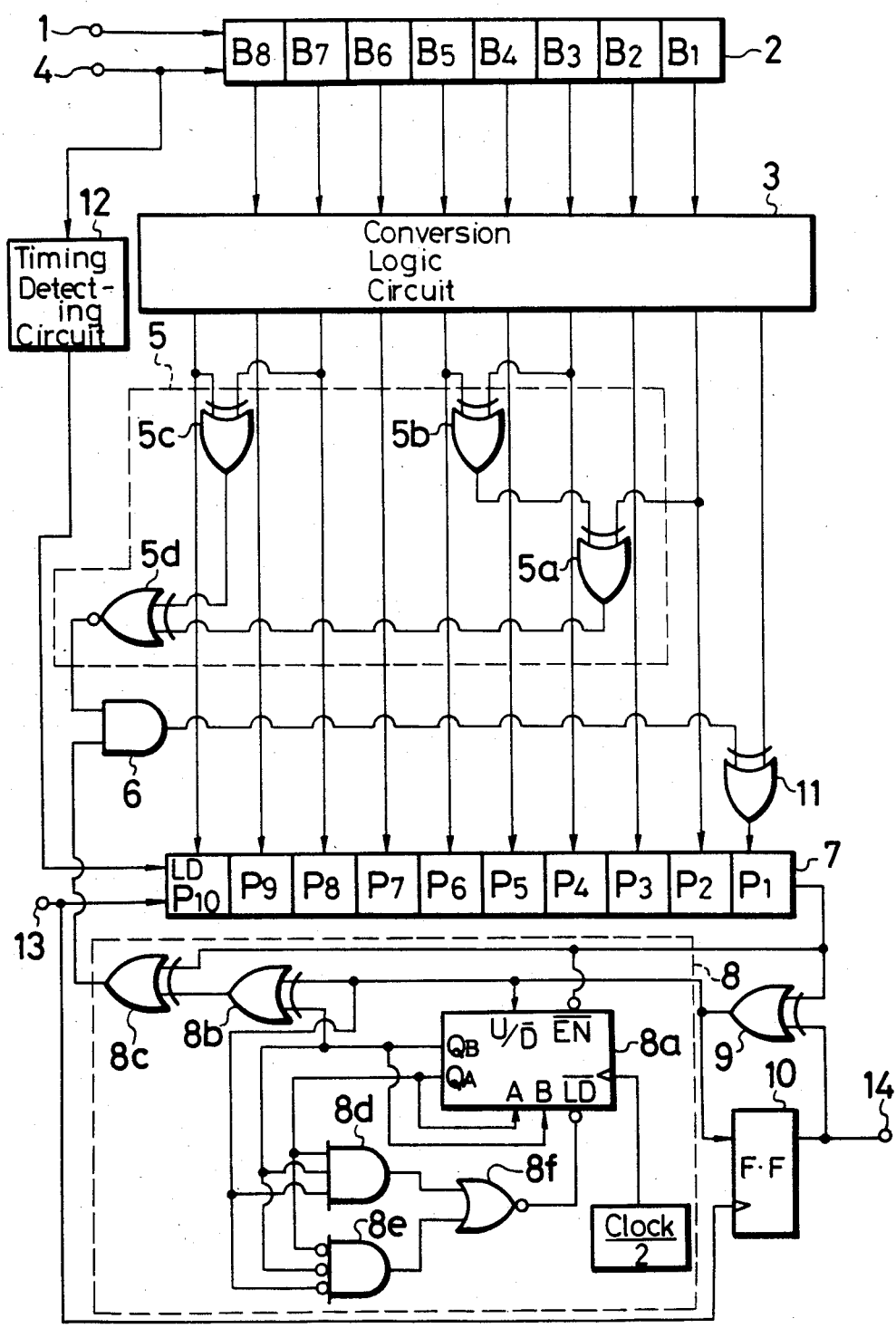
FIG. 5 schematically illustrates an apparatus for generating an n-bit NRZI-coded converted digital signal from an m-bit base digital signal.
Figure 8:
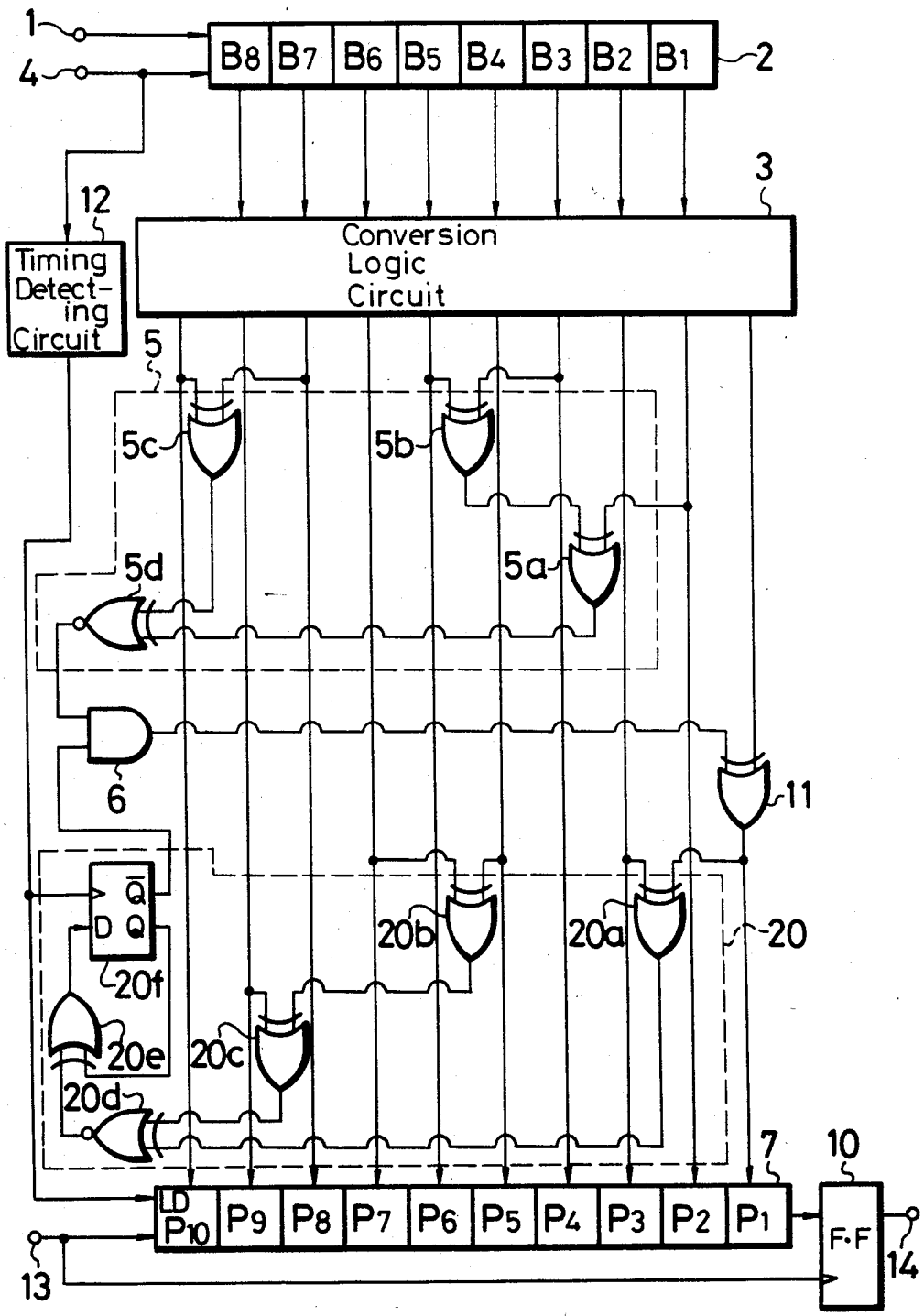
FIG. 8 schematically illustrates an embodiment of an information converting apparatus according to the present invention.

FIG. 8 shows an embodiment of the present invention. In this embodiment, a circuit arrangement corrssponds to the example of the conversion for Tmax=4T' which is based on Table II, namely, the example of the circuit shown in FIG. 5. Accordingly, in FIG. 8, like parts corresponding to those in FIG. 5 are marked with the same references and will not be described in detail.

As described above, in the case of Tmax=4T', there exist combinations having zero DC charge (the first bit is fixed) and ±2 DC charges (the first bit is variable) so that both of them must be discriminated from each other. Accordingly, this embodiment uses the identifying or detecting circuit 5 as that used in the example shown in FIG. 5. In this case, a T-type flip-flop circuit, for example, is used as the flip-flop circuit 10.

In this invention, an explanation will be given on a case in which the DC charge of a present combination for the succeeding combination can be calculated only by checking the parity of odd and/or even of an odd-numbered bit of the combination, without using the NRZI-coded waveform.

As described above, to detect whether the DC charge of the combination is 0 or ±2, the even-numbered bit of the combination is taken into consideration.

Then, if the number of the digital zeroes is even, the DC charge is 0 (DC=0), while if it is odd, the DC charge is regarded as ±2 (DC=±2). In this case, let it be assumed that the detection information be Pe. And so, if Pe=0, the DC charge is 0, while if Pe=1, the DC charge is ±2. Then, if the conversion logic circuit 3 produces its output of combination having the DC charge DSV'=+1 up to that time, when Pe=1, the combination may be restricted as that with the −2 DC charge. Accordingly, when Pe=1 and DSV'=−1, the first bit of the combination is inverted in level to be the combination having +2 DC charge.

Next, from the combination of n bits which were inverted in level as required, namely, 10-bit combination in this case, the DC charge is calculated for the succeeding combination. Let us assume that the parity of odd and/or even of the n-bit combination be P. Then, for the zero DC charge, if P=0, DSV=DSV' is established, while if P=1, DSV=−DSV' is established. On the other hand, for the DC charge of ±2, if P=0, DSV=−DSV', while if P=1, DSV=DSV'. The reason for this is as follows. When the DC charge is 0, the DSV is not changed so that DSV=DSV' is established. However, since the last bit of the NRZI-coded waveform in the combination of P=1 is the opposite level of the last bit of the preceding combination, if the DSV is defined assuming that the level of the last bit of the preceding combination is low level, the last bit of the present combination is high level so that such level becomes the low level for the succeeding combination. In consequence, it is necessary to invert the code of the DC charge information.

For the DC charge of ±2, if P=0, the state of the DC charge is changed and the range in which the DC charge is changed is limited from +1 to −1 or −1 to +1 so that DSV=−DSV' is established finally. On the other hand, when P=1 is established, the level of the last bit is different from the level of the last bit of the preceding combination so that DSV=DSV' is established finally.

To summarize the above facts, only when the DC charge is 0 and P=1 and the DC charge is ±2 and P=0, it is sufficient for the DC charge information that the DC charge information of the preceding combination is inverted, The following Table IV shows the above summarized fact on the whole.

TABLE IV

| DSV' | DC | P | DSV | Pe | P$_0$ |
|---|---|---|---|---|---|
| 0 |  | 0 | 0 | 0 | 0 |
| (−1) | 0 | 1 | 1 | 0 | 1 |
|  |  | 0 | 1 | 1 | 1 |
|  | +2 | 1 | 0 | 1 | 0 |
| 1 |  | 0 | 1 | 0 | 0 |
|  | 0 | 1 | 0 | 0 | 1 |
|  |  | 0 | 0 | 1 | 1 |
|  | −2 | 1 | 1 | 1 | 0 |

On Table IV, reference P$_0$ designates odd and/or even parity for P and Pe. When the detecting information Pe is 0, the DC charge is 0, while the detecting information Pe is 1, the DC charge is ±2. Thus, under the condition that the modulo.-addition of P and Pe is expressed as P$_0$ (P$_0$=P⊕Pe), when P$_0$ is 1, the level of the DC charge DSV is inverted.

Further, Pe represents the parity indicative of the number of "0", although P represents the parity indicative of "1", if n in the m/n-conversion is taken as even number, P may be the parity indicative of the number of "0". Accordingly, it is possible to say that P which is the odd and/or even parity of Pe and P is the parity indicative of the number of "0". That is, transmission information of the DC charge is inverted and then transmitted if the odd and/or even parity indicative of the number of "0" at the odd-numbered bit of the combination is 1.

Therefore, in this embodiment, there is provided a detecting circuit 20 for detecting the DC charge, which consists of an EOR circuit 20a to which the first and third bits of 10 bits of each combination are supplied, an EOR circuit 20b to which the fifth and seventh bits are supplied, an EOR circuit 20c to which the output from the EOR circuit 20b and the ninth bit are supplied, an ENOR circuit 20d to which the outputs from the EOR circuits 20a and 20c are supplied, an EOR circuit 20e which is supplied at its one input terminal with the output from the ENOR circuit 20d and a D-type flip-flop circuit 20f to which the output from the EOR circuit 20e is supplied. The output Q of the flip-flop circuit 20f is supplied to the other input terminal of the EOR circuit 20e, while the inverted output $\overline{Q}$ thereof is supplied to the other input terminal of the AND circuit 6.

The EOR circuits 20a to 20c take the parities of the odd-numbered bits. In this case, since the number of the odd-numbered bits is 5 if the number of n is taken as 10, such parity is finally inverted by the ENOR circuit 20d as the parity indicative of the number of "0". When its value is 1, the output of the flip-flop circuit 20f is inverted by the EOR circuit 20e at the next stage. In other words, the preceding DC charge information is inverted in level and then supplied to the flip-flop circuit 20f. Then, in order that when DSV40 = −1, namely, the signal level is "0", the signal level "1" is delivered, the inverted output $\overline{Q}$ is derived from the flip-flop circuit 20f and then fed to the other input terminal of the AND circuit 6.

Consequently, the detecting circuit 20 produces the high level output when the DC charge DSV' is −1.

On the other hand, as mentioned above, the identifying circuit 5 produces the high level output when the DC charge is −2 so that the AND circuit 6 produces the signal "1" when the both outputs of the identifying circuit 5 and the detecting circuit 20 are high level. Then, the output from the AND circuit 6 is supplied to the one input terminal of the EOR circuit 11. At this time, the EOR circuit 11 inverts the first bit of the 10 bits supplied to the other input terminal thereof from the conversion logic circuit 3 and then supplies the same to the shift register 7.

As set forth above, in this embodiment, without using the NRZI-coded waveform, only by checking the odd and/or even parity of the odd-numbered bits of each combination, it is possible to calculate the DC charge for the succeeding combination so that the circuit arrangement can be simplified.

Figure 7:
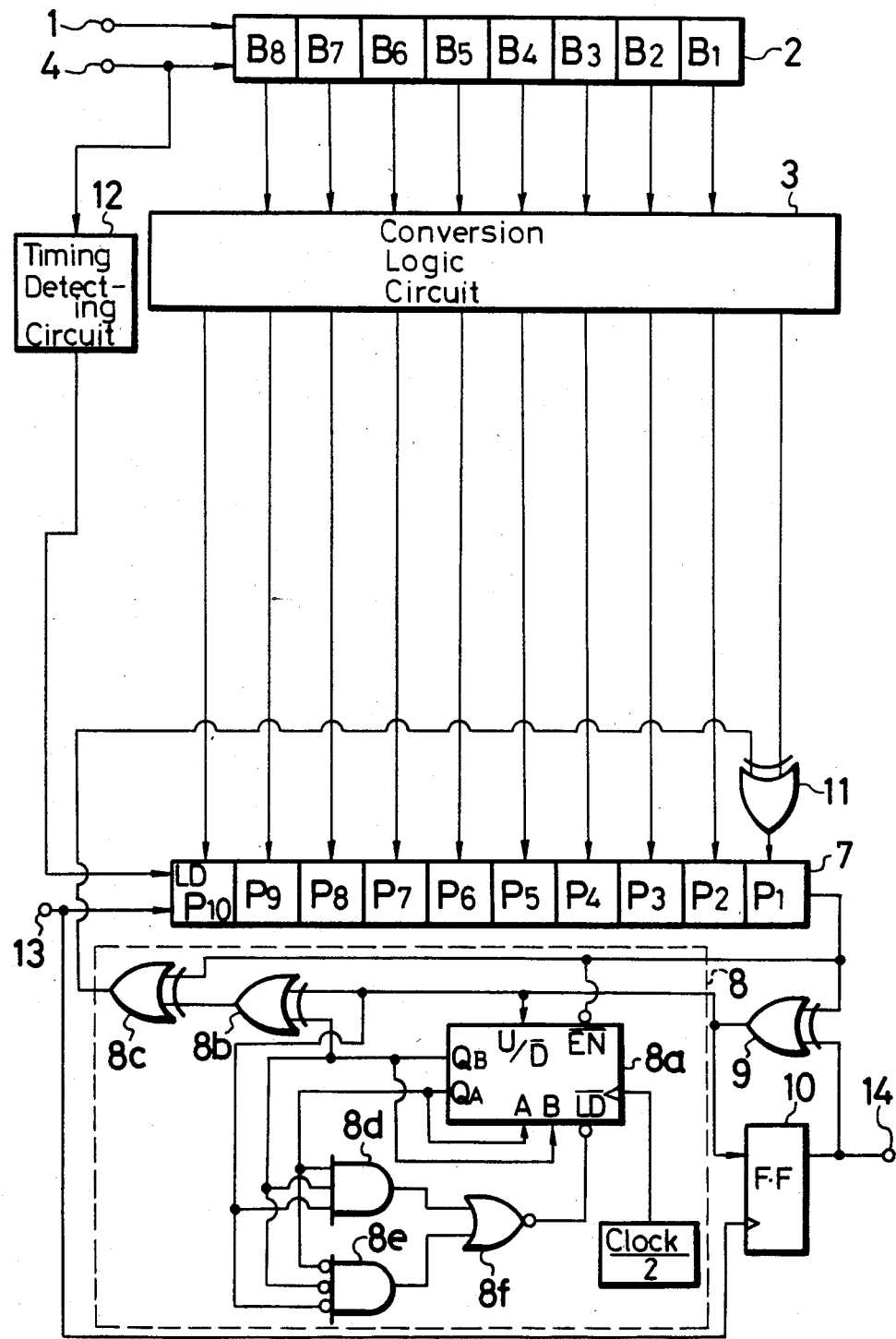
FIG. 7 schematically illustrates an apparatus for generating an n-bit NRZI-coded converted digital signal from an m-bit base digital signal.

Since there exist two states of −1 DC charge and +1 DC charge ("0" and "1" in signal level), DSV' may be either 1 or −1 in the beginning of the modulation. Accordingly, as shown in FIGS. 5 and 7, the circuit which uses the AND circuits 8d and 8e and the NOR circuit 8f to initially set the DC charge DSV to +1 or −1 is not required.

Figure 9:
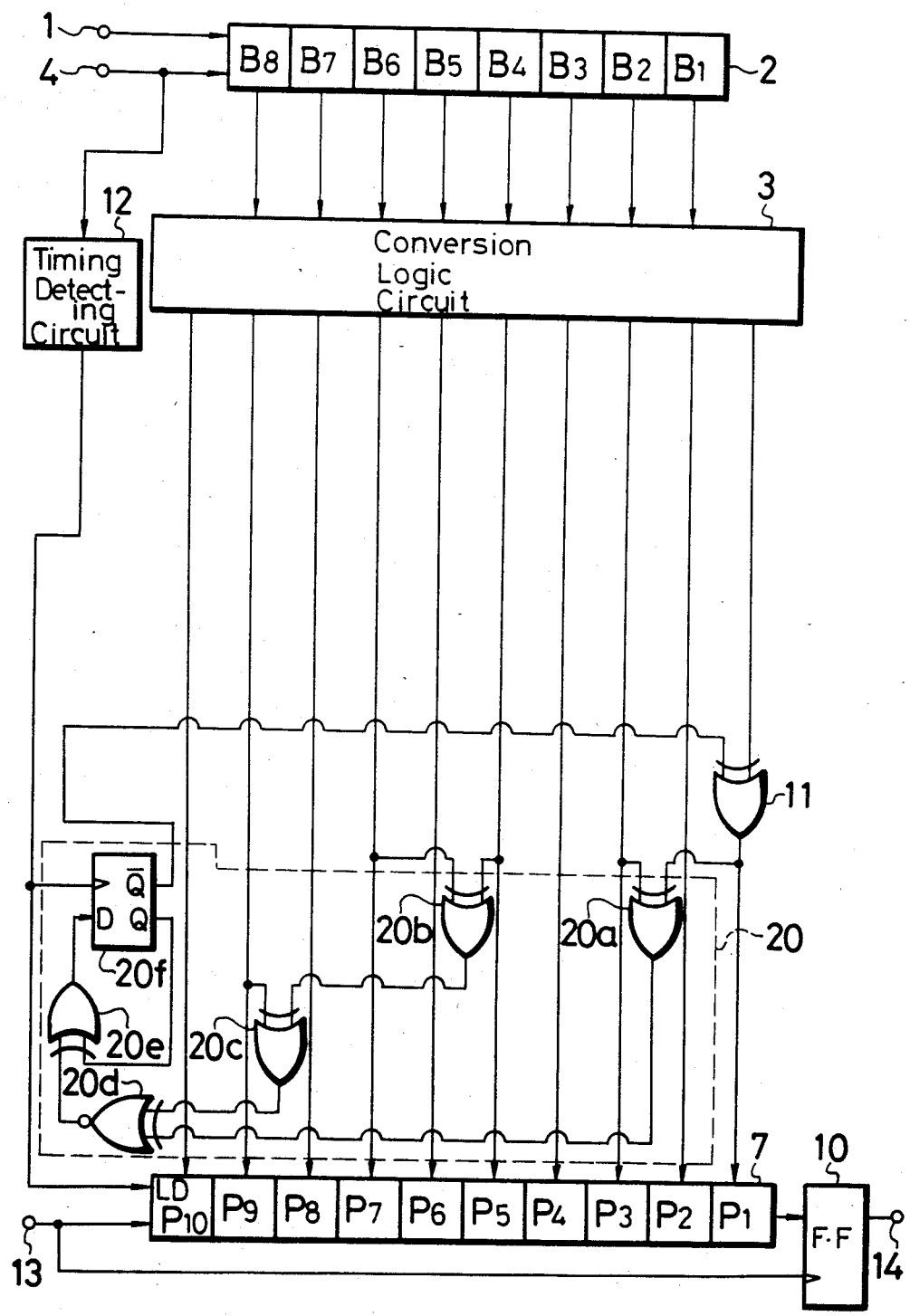
FIG. 9 schematically illustrates another embodiment of the information converting apparatus according to the present invention.

FIG. 9 schematically illustrates another embodiment of the present invention. This embodiment corresponds to the example of the conversion of Tmax=5T' based on Table III, namely, the example of the circuit shown in FIG. 7. Accordingly, in FIG. 9, like parts corresponding to those in FIG. 7 are marked with the same references and will not be described in detail.

As described above, in the case of Tmax=5T', the combination having zero DC charge is used similarly to the combination having ±2 DC charges under the state that all of the first bit is converted. As a result, it is not necessary to use the detecting circuit 5 which is used in FIG. 8 and so on. Accordingly, in this case, only the detecting circuit for detecting the DC charge is required and hence the detecting circuit 20 used in FIG. 8 is employed. In that case, the output of the detecting circuit 20, namely, the inverted output $\overline{Q}$ of the flip-flop circuit 20f is directly supplied to one input terminal of the EOR circuit 11.

Also in this case, if the output from the logic conversion circuit 3 is produced under being unified in the combination having, for example, DSV=+1, when the converted combination begins with DSV=−1, the high level output is supplied from the detecting circuit 20 to the EOR circuit 11, in which the first bit thereof is inverted and then fed to the shift register 7.

As described above, according to this embodiment, it is possible to achieve substantially similar action and effect to those of the first embodiment. Particularly, this embodiment requires no identifying circuit 5 as compared with the first embodiment so that the circuit arrangement can be simplified more.

In this invention, the combination converted as mentioned above can be demodulated by a desired demodulating circuit.

While in the above embodiments the cases of Tmax=4T' and Tmax=5T' are described, this invention is not limited to the above cases but can be applied to other combinations including a combination in which at least DC charge is controlled to be less than ±2, for example, a combination which can be controlled to be combined with a combination having zero DC charge and whose DC charge is fixed and so on.

The above description is given on the preferred embodiments of the invention, but it will be apparent that many modifications and variations could be effected by one skilled in the art without departing from the spirits or scope of the novel concepts of the invention, so that the scope of the invention should be determined by the appended claims only.

I claim as my invention:

1. A method for converting a digital signal into an NRZI (non-return to zero, inverted)-coded signal, the method comprising the steps of:
    dividing a base digital signal into a series of base words with each m bits of data;
    converting said base digital signal into a converted digital signal by matching a converted word with each said base word, each said converted word having n bits of data, wherein n is greater than m and said converted digital signal has a predetermined maximum number of consecutive digital zeroes;
    detecting if the value of every odd-numbered bits of said converted word is digital zero;
    producing a detecting signal according to the result of said detecting;
    controlling said converted word in response to said detecting signal; and
    modulating said converted digital signal as an NRZI-coded digital signal.

2. A method for converting a digital signal into an NRZI-coded signal, the method comprising the steps of:
- dividing a base digital signal into a series of base words with each eight bits of data;
- converting each said base word into a converted word having ten bits of data;
- detecting if the value of every odd-numbered bits of said converted word is digital zero;
- producing a detecting signal in response to a parity of said digital value in every odd-numbered bits of said converted word;
- controlling the first bit of said converted word in response to said detecting signal; and
- modulating said converted word into an NRZI-code.

3. An apparatus for converting a digital signal into an NRZI-coded signal, the apparatus comprising:
- dividing means for dividing a base digital signal into a series of base words with each m bits of data;
- converting means for converting said base digital signal into a converted digital signal by matching a converted word with each said base word, each said converted word having n bits of data, wherein n is greater than m and said converted digital signal has a predetermined maximum number of consecutive digital zeroes;
- detecting means for detecting if the value of every odd-numbered bits of said converted word is digital zero; p1 producing means for producing a detecting signal according to the result of said detecting;
- controlling means for controlling said converted word in response to said detecting signal; and
- generating means for generating said converted digital signal as an NRZI-coded digital signal.

4. An apparatus for converting a digital base signal into an NRZI-coded signal having a DC component substantially equal to zero and a predetermined maximum time between level transitions, the apparatus comprising:
- dividing means for dividing a base digital signal into a series of base words with each m bits of data;
- memory means for converting said base word into a converted word having n bits of data, wherein n is greater than m and said converted word has a predetermined maximum number of consecutive digital zeroes;
- detecting means for detecting if the digital value of every odd-numbered bits of said converted word is digital zero and for producing a detecting signal in response to a parity of said digital value in every odd-numbered bits of said converted word;
- controlling means for inverting the first bit of said converted word in response to said detecting signal; and
- modulating means for modulating said converted word into an NRZI-coded.

5. An apparatus according to claim 4, wherein said detecting means comprisis logic means for generating said detecting signal in response to a parity of said digital value in every odd-numbered bits of said converted word and a memory circuit for holding said detecting signal during every converting cycle.

6. An apparatus according to claim 5, wherein said logic means includes an exclusive-OR circuit and said memory circuit includes a flip-flop circuit.

* * * * *